(12) United States Patent
Houghton et al.

(10) Patent No.: US 6,498,518 B1
(45) Date of Patent: Dec. 24, 2002

(54) LOW INPUT IMPEDANCE LINE/BUS RECEIVER

(75) Inventors: Russell J. Houghton, Essex Junction, VT (US); Jack A. Mandelman, Stormville, NY (US); Azzouz Nezar, Shillington, PA (US); Wilbur D. Pricer, Charlotte, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 09/617,680

(22) Filed: Jul. 14, 2000

(51) Int. Cl.[7] .................................................. H03K 5/22
(52) U.S. Cl. ............................ 327/72; 327/74; 327/68; 327/77
(58) Field of Search ................................. 327/538, 542, 327/541, 318, 68, 72, 77; 323/315, 317; 257/544

(56) References Cited

U.S. PATENT DOCUMENTS

| | | | |
|---|---|---|---|
| 5,220,207 A | 6/1993 | Kovalcik et al. | 327/63 |
| 5,394,007 A * | 2/1995 | Reuss et al. | 257/544 |
| 5,471,131 A | 11/1995 | King et al. | 323/314 |
| 5,473,276 A | 12/1995 | Throngnumchai | 327/432 |
| 5,654,665 A * | 8/1997 | Menon et al. | 327/541 |
| 5,923,202 A * | 7/1999 | Merrill | 327/318 |
| 5,939,991 A * | 8/1999 | Deng | 340/638 |

OTHER PUBLICATIONS

Y. Nakagome et al., "A 1.5V Circuit Technology for 64Mb DRAMs", 1990 Symposium on VLSI Circuits, pp. 17–18.

* cited by examiner

*Primary Examiner*—Tuan T. Lam
*Assistant Examiner*—Hiep Nguyen
(74) *Attorney, Agent, or Firm*—McGinn & Gibb, PLLC; Richard A. Henkler, Esq.

(57) ABSTRACT

A current sensing circuit connected to a power supply terminal and having at least one input terminal and at least one output terminal includes at least one bipolar transistor having a base, emitter and collector, at least one current mirror amplifier connected to the power supply terminal, the current mirror amplifier having an input connected to the collector and having at least one output connected to the emitter, and a DC voltage source connected to the base.

12 Claims, 9 Drawing Sheets

LOW INPUT IMPEDANCE LINE/BUS RECEIVER

BACKGROUND OF THE INVENTION

1. Field of the Invention

The present invention generally relates to a bipolar current sensing device having increased gain and low input impedance.

2. Description of the Related Art

Conventional systems utilize current sensing as a circuit technique for receiving signal currents on a highly capacitive bus. In bipolar technology, a very commonly used current sensing circuit is known as a common base configuration, which offers low input impedance at the emitter and high output impedance at the collector. This configuration would be an ideal solution, for example, in a complimentary metal oxide semiconductor (CMOS), dynamic random access memory (DRAM) for input/output (I/O) bus sensing. However, in a CMOS designed DRAM, the desired vertical NPN bipolar device, having high gain and low terminal resistances, previously did not exist without additional complexity and cost.

An example of a conventional CMOS circuit of this type is discussed in a paper entitled "A 1.5V Circuit Technology for 64 Mb DRAM'S" presented at the 1990 Symposium on VLSI Circuits, incorporated herein by reference. The CMOS circuit provides the desired advantage of low input impedance and high output impedance, but this is accomplished with undesired higher circuit complexity, higher current consumption and poorer performance.

Therefore, there is a need for a bipolar current sensing device having high gain and low terminal resistances that operates at relatively low power and high performance in the presence of high bus capacitance.

SUMMARY OF THE INVENTION

In view of the foregoing and other problems of the conventional methods, it is, therefore, an object of the present invention to provide a structure for a current sensing circuit connected to a power supply terminal and having at least one input terminal and at least one output terminal. The current sensing circuit includes at least one bipolar transistor having a base, emitter and collector, at least one current mirror amplifier connected to the power supply terminal, the current mirror amplifier having an input connected to the collector and having at least one output connected to the emitter, and a DC voltage source connected to the base.

The input terminal is connected to emitter and the output terminal is connected to the collector. The DC voltage source can be a reference voltage or the power supply terminal. The current mirror amplifier comprises at least two metal oxide semiconductor transistors. The output terminal is adapted to drive a metal oxide semiconductor current mirror current source.

The invention also includes a method of manufacturing a bipolar device in a dynamic random access memory (DRAM) manufacturing process, that includes implanting a first-type dopant in a collector layer in a substrate (the implanting of the first-type dopant in the collector layer is performed simultaneously with implanting the first-type dopant in a trench plate layer in the DRAM manufacturing process), implanting a second-type dopant in a base layer in the substrate, the base layer being above the collector layer (wherein the implanting of the second-type dopant in the base layer is performed simultaneously with implanting the second-type dopant in a surface layer in the DRAM manufacturing process), forming conductive connections to the collector layer and the base layer (wherein the forming of the conductive connections is performed simultaneously with forming support device connections in the DRAM manufacturing process), forming a conductive stud having the first-type impurity above an emitter region in the base layer (wherein the forming of the conductive stud is performed simultaneously with forming a bit line stud in the DRAM manufacturing process), and annealing the structure to diffuse the first-type impurity into the emitter region (wherein the annealing is performed simultaneously with an annealing process in the DRAM manufacturing process).

The forming of the conductive stud comprises forming a mask over the substrate, the mask including an opening over the emitter region and depositing doped polysilicon in the opening. The conductive stud reduces a terminal resistance of the bipolar device. The first-type dopant comprises an N-type dopant, the second-type dopant comprises a P-type dopant and t bipolar device comprises a vertical NPN bipolar device.

BRIEF DESCRIPTION OF THE DRAWINGS

The invention will be described in detail with reference to the following drawings in which like reference numerals refer to like elements.

DETAILED DESCRIPTION OF PREFERRED EMBODIMENTS OF THE INVENTION

Bipolar devices having only moderate gain and poor terminal resistances often preexist as part of modem CMOS structures or can be added with a minimum cost and complexity. These devices typically have low beta and/or high terminal resistance and are, therefore, not effective for current sensing. However, this invention, as described below, combines current mirror structures with such bipolar devices to allow the bipolar devices to economically perform common base current sensing.

The invention is presented in two parts below. First, a DRAM CMOS circuitry containing a low-performance bipolar device is described. Second, the structure and fabrication of a vertical NPN device having an N+ polysilicon emitter is described.

Figures 1A, 1B:
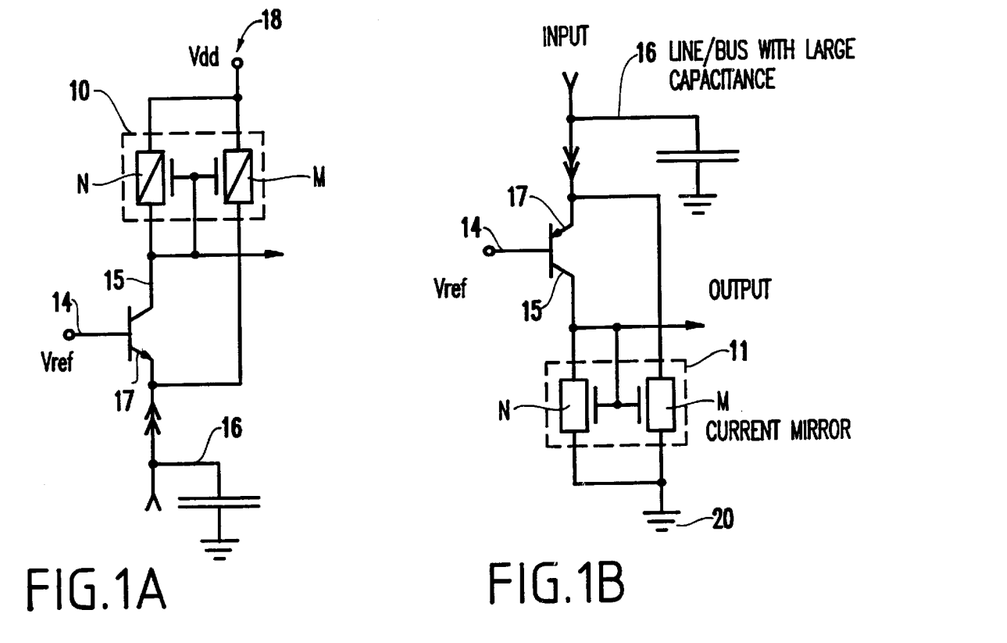
FIGS. 1A–1D depict the basic circuitry of the invention.

FIG. 1A–1D show four embodiments of the most basic topology of the invention circuitry. An NPN version of this circuit is shown at FIG. 1A (a PNP complementary version is shown in FIG. 1B). In the structure shown in FIG. 1A, the base 14 is connected to a DC reference voltage source (Vref) that, in a preferred embodiment, is equivalent to a signal ground, and the emitter 17 is connected to a capacitive line/bus input 16 carrying a signal current. A P-type metal oxide semiconductor (PMOS) current mirror 10 is shown. In the complimentary version of FIG. 1B, an N-type metal oxide semiconductor (NMOS) current mirror 11 is shown. The current mirror 10,11 is connected as a load between the collector 15, also the output terminal of the circuit, and the power supply terminal (Vdd) 18. The current mirror output is fed back to the emitter 17.

When the current mirror devices, M and N, are sized for large gain (M/N>>I), the result will be to make the low-performance bipolar device appear to have high current gain (Beta) and low terminal resistances. This is advantageous because the NPN beta and terminal resistances are improved by the PMOS current mirror gain factor. Thus, the invention allows the low-performance bipolar devices (e.g., ones having only moderate gain and poor terminal resistance) to be used as low-resistance, high-gain devices. In other words, the amplification provided by the current mirror amplifiers 10,11 fed back to the emitter of the bipolar device, effectively decreases the terminal resistance and increases gain. As a result, the basic circuit of FIG. 1A becomes attractive for I/O bus sensing in a CMOS DRAM.

Figure 1C:
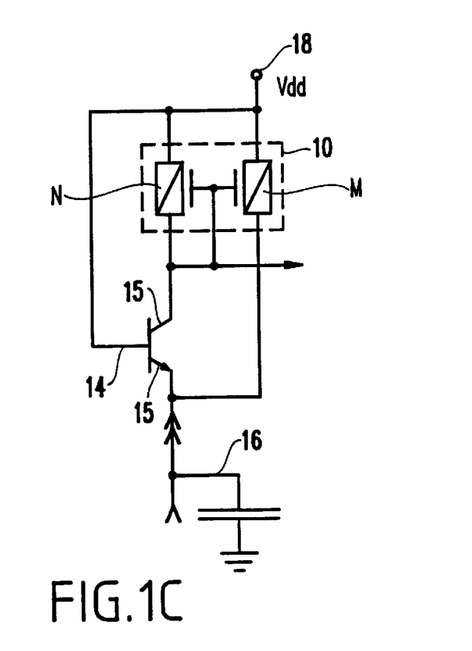
Figure 1D:
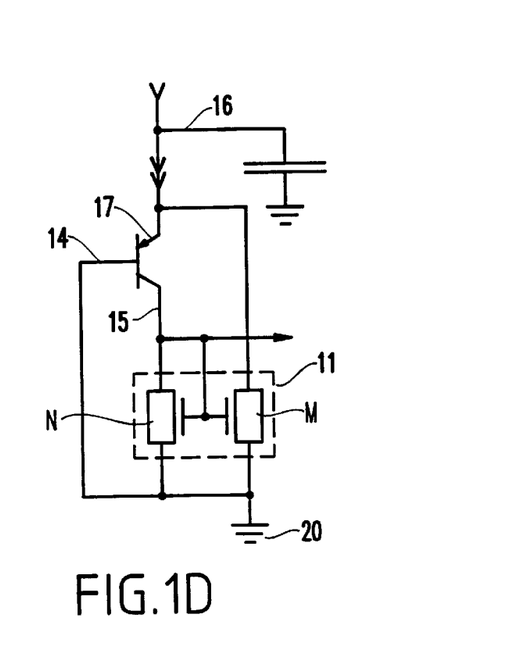

FIGS. 1A and B show the base connected to Vref 14. However, the base may also be more conveniently connected to Vdd 18 or ground 20 as shown in FIGS. 1C and 1D. In addition, FIG. 1C depicts the circuit using the PMOS current mirror 10 while FIG. 1D depicts the circuit using an NMOS current mirror 11.

Figure 2A:
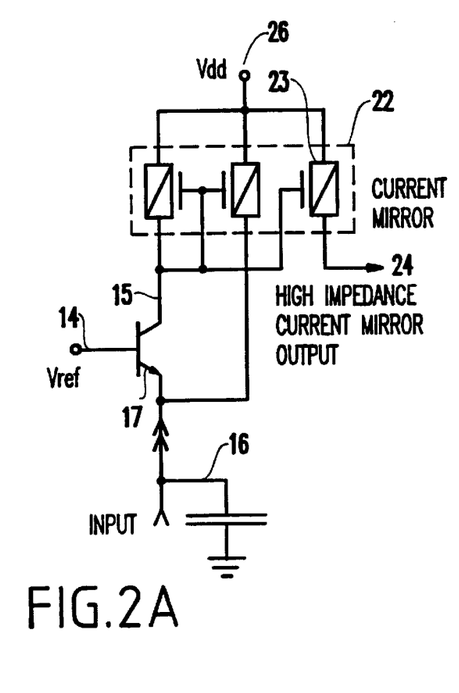
FIGS. 2A–2E depict the basic circuitry of FIGS. 1(a)–1(d) with the addition of a current mirror.
Figure 2B:
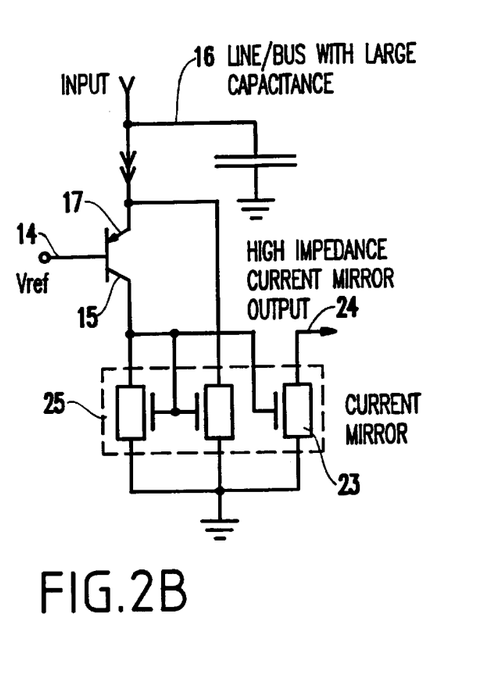
Figure 2C:
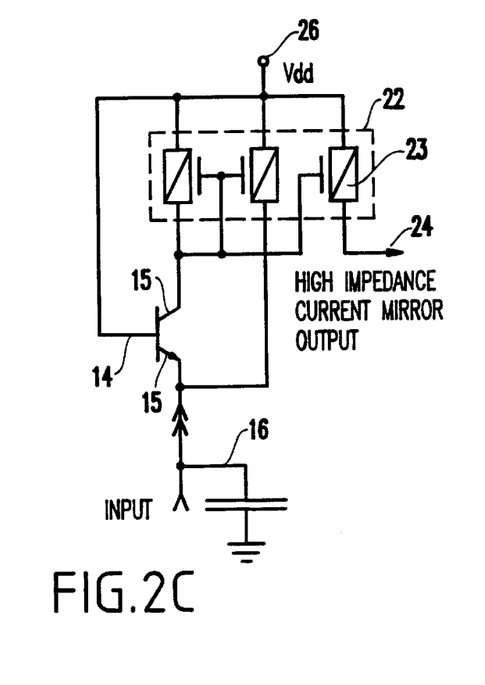
Figure 2D:
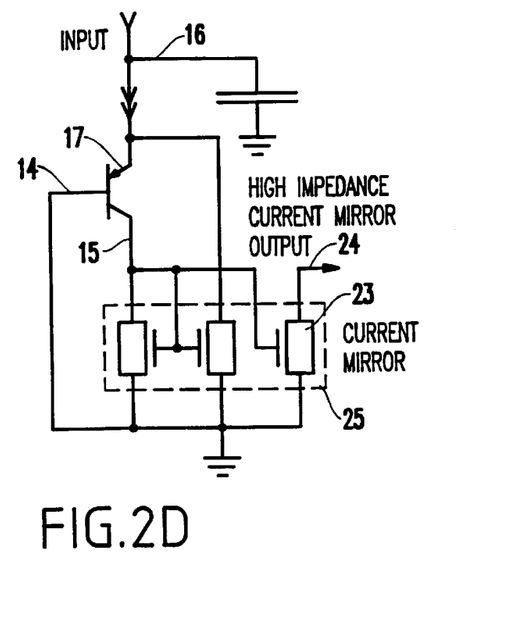
Figures 2E, 3A:
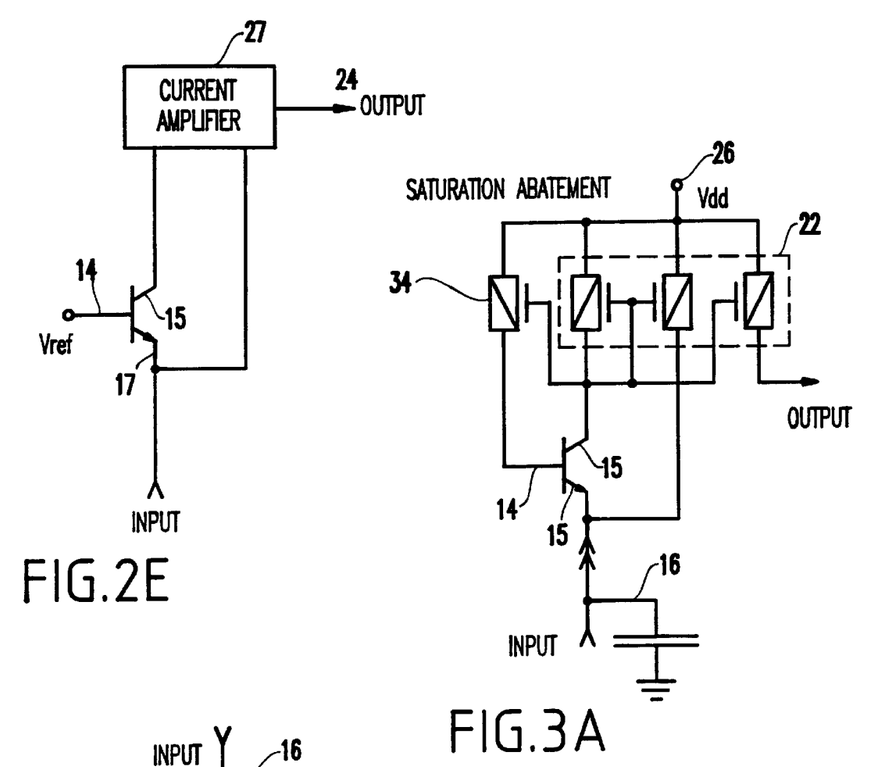
FIGS. 3A and B depict the circuitry of FIGS. 2(c) and (d) with the addition of a MOS device.

FIGS. 2A–2D depict the basic circuitry of FIGS. 1A–1D with the addition of current mirror circuits 22, 25 which incorporate additional transistors, 23 to provide higher voltage swings. This modification permits nearly full CMOS voltage swings when a high impedance load is connected to the output 24. As described above, FIGS. 2A and 2C depict the invention using PMOS current mirrors 22, and FIG. 2B and 2D depict the compliment of FIG. 2A using an NMOS current mirrors 25. While specific current mirror devices have been shown above, the invention is not limited to such structures. As shown in FIG. 2E, and as would be known by one ordinarily skilled in the art given this disclosure, the invention is useful with any form of current amplifier 27.

In the circuit options shown in FIGS. 2C and 2D, the Vref in FIGS. 2A and 2B is replaced by Vdd and ground respectively. In the structures shown in FIGS. 2C and 2D, the collector 15 is at a potential that forward biases the collector/base junction risking the disastrous effects of saturation. Saturation degrades circuit performance due to the decrease in collector/base junction response. The forward bias voltage is determined by the current mirror field effect transistor (FET) threshold, bipolar gain and input current. High threshold and low gain puts the device closer to saturation.

Figure 3B:
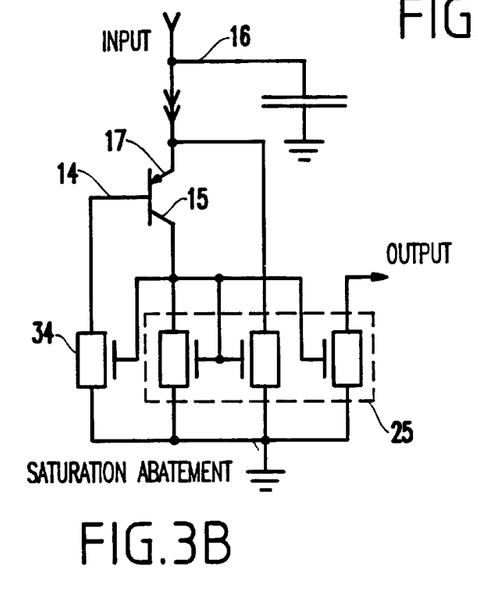

The structures shown in FIGS. 3A–3B prevent such saturation. As shown in FIGS. 3A and B, an additional MOS device 34 is connected between the base 14 and Vdd in FIG. 3A or ground in FIG. 3. The MOS device 34 reduces the risk of saturation which exists in the circuits depicted in FIGS. 2C and D. More specifically, the MOS device 34 is driven by the current mirror 22, 25 and operates in the linear region acting as a resistance to create a base voltage drop that reduces the forward bias of the collector/base junction. As would be known by one ordinarily skilled in the art given this disclosure, the MOS device width may be scaled to achieve the desired voltage drop to provide a sufficient margin against saturation. However, the MOS device 34 is otherwise identical to the current mirror and tracks threshold and gain. Such tracking is important to keep the voltage drop relatively constant with threshold and gain variations.

Figure 4:
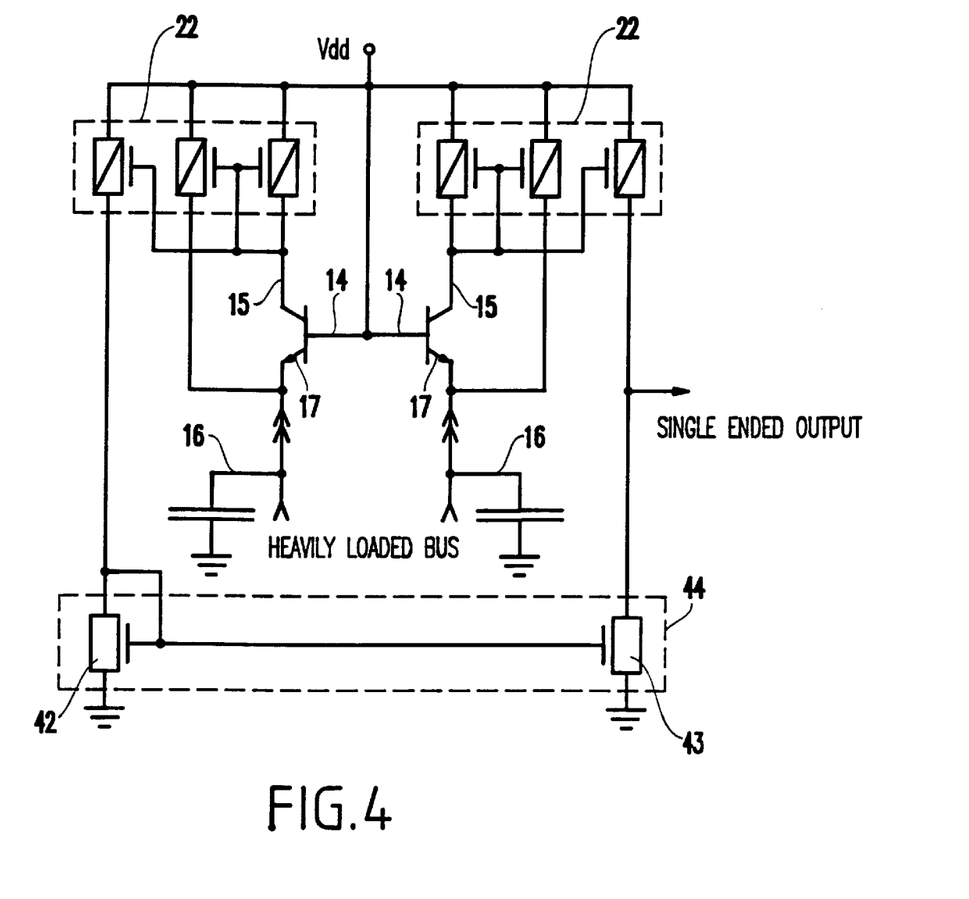
FIG. 4 depicts an application of the invention to a highly capacitive bus.

Another embodiment of the inventive bipolar device for low impedance current sensing on a highly capacitive bus is shown in FIG. 4. Two of the FIG. 2A circuits 22 with high impedance current mirror outputs are arranged in a differential fashion and drive N-Type Metal Oxide Semiconductor (NMOS) current mirror 44 (consisting of two transistors 42, 43) to the single ended output shown. The additional current mirror provides even more amplification to produce an output voltage swing that is capable of driving conventional CMOS logic.

Referring now to FIGS. 5A–6H a manufacturing process for vertical NPN bipolar device fabrication formed within DRAM processing constraints is illustrated. More specifically, FIGS. 5A–5I illustrate standard processing steps to manufacture a deep trench storage device (e.g., DRAM device) and associated nodes, transistors, contacts, etc. The details of the processing shown in FIGS. 5A–5I is well known to those ordinarily skilled in the art. Therefore, the detailed discussion regarding the different materials and processing conditions utilized to form the structures in FIGS. 5A–5I, will not be included herein so as not to unnecessarily obscure the salient features of the present invention. FIGS. 6A–6H illustrate corresponding process steps that the invention takes during the standard processing shown in FIGS. 5A–5I to form vertical NPN bipolar devices. FIGS. 5A–5I are shown corresponding to FIGS. 6A–6H to illustrate that the invention does not require additional processing steps and that bipolar devices can be manufactured simultaneously with DRAM trench devices, without increasing manufacturing time or costs.

Figure 5A:
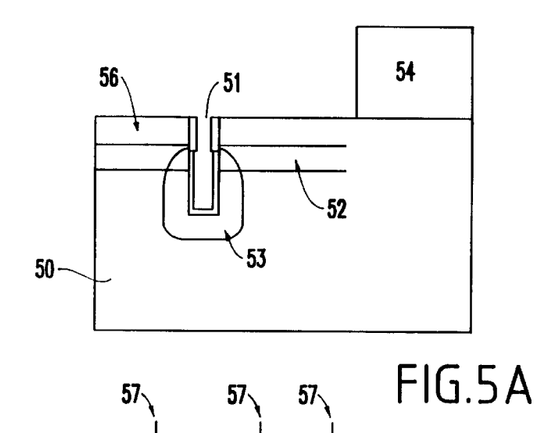
FIGS. 5A–5I depict the DRAM fabrication steps.
Figure 5B:
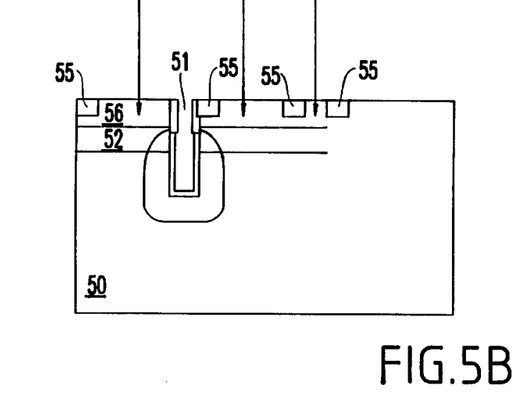
Figure 5C:
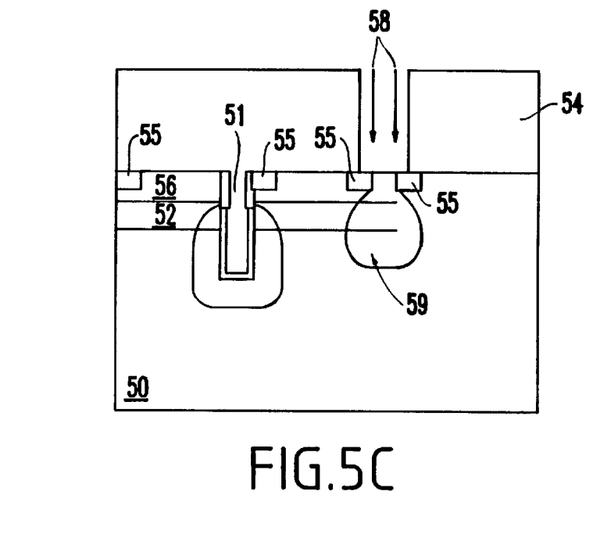
Figure 5D:
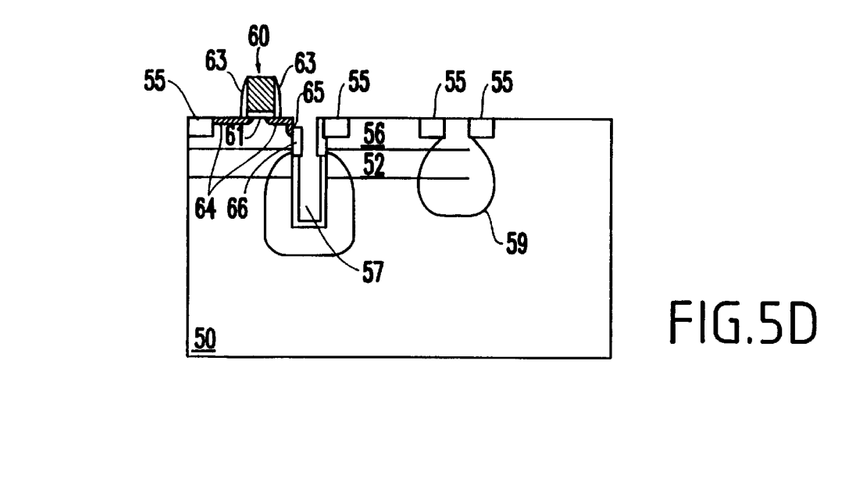
Figure 5E:
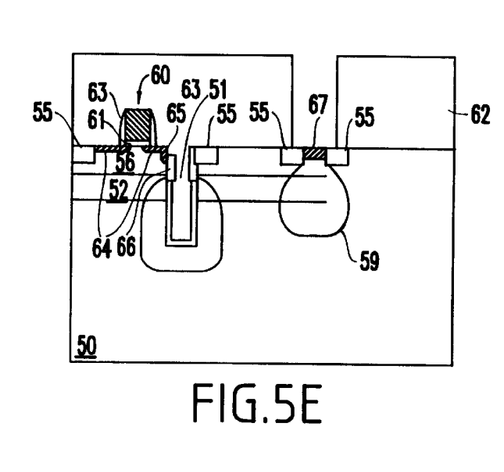
Figure 5F:
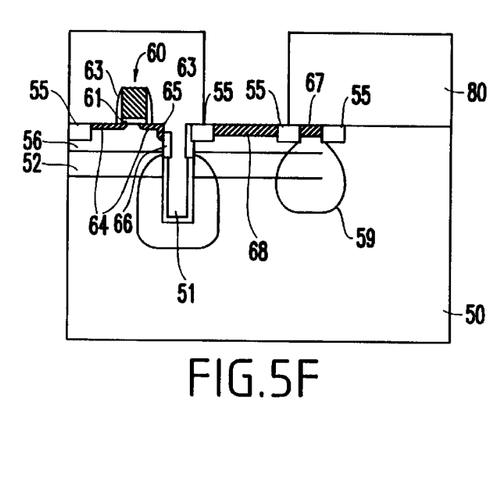
Figure 5G:
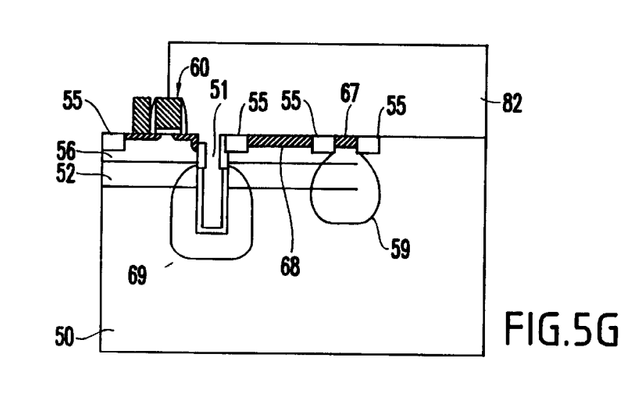
Figure 5H:
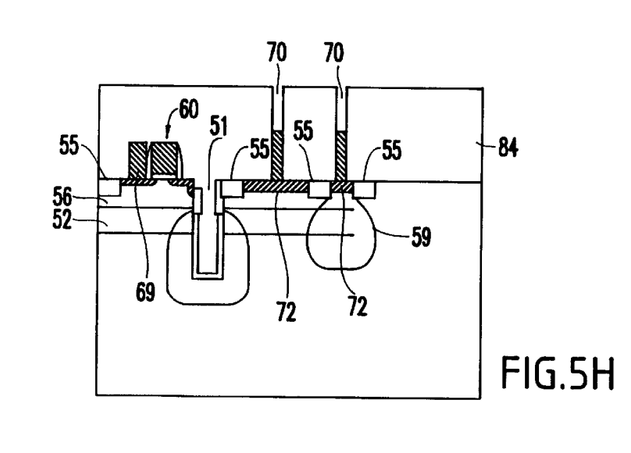
Figure 5I:
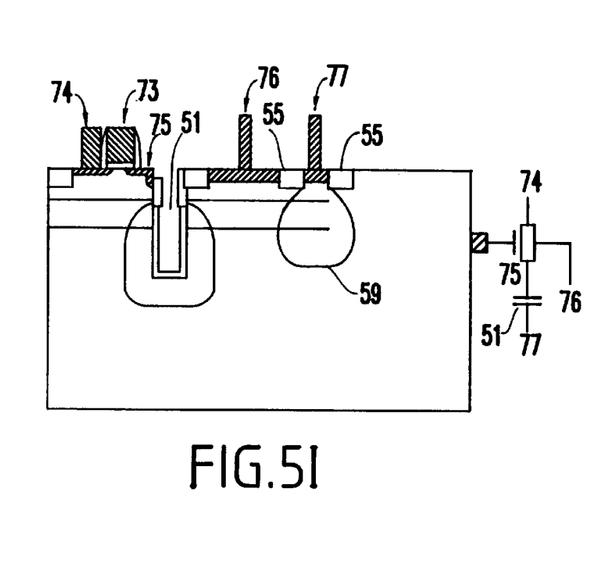
Figure 6A:
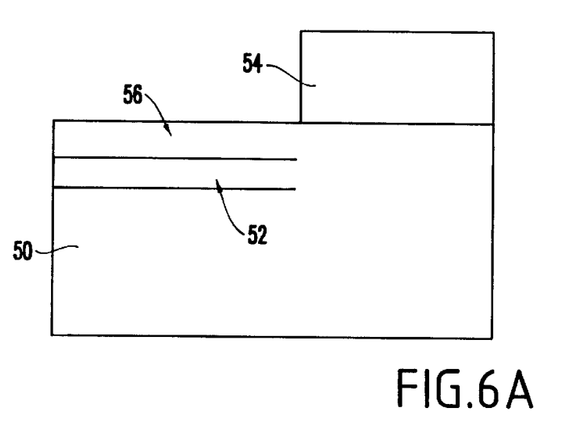
FIGS. 6A–6H depict the bipolar circuit fabrication steps.
Figure 6B:
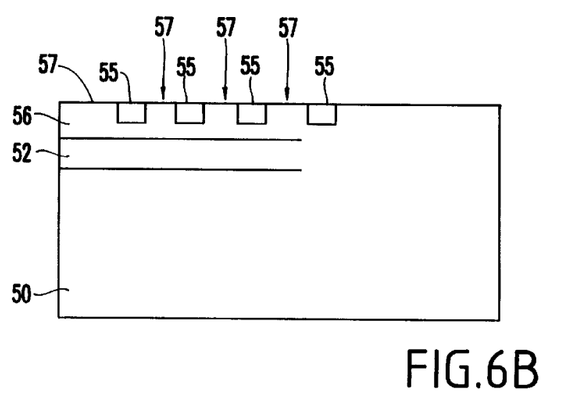
Figure 6C:
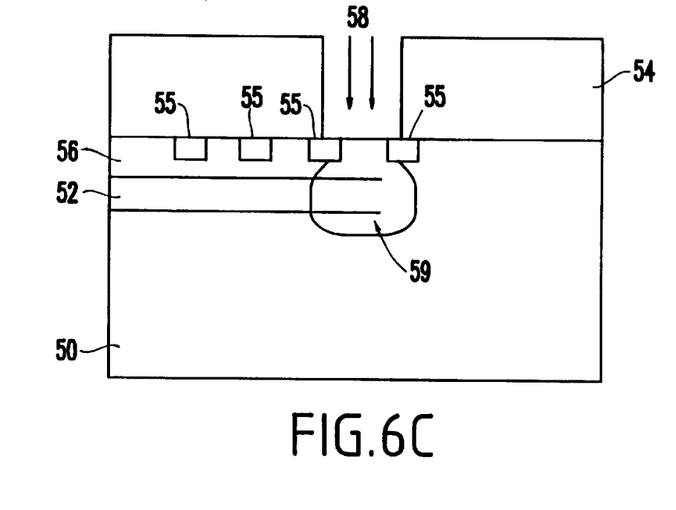
Figure 6D:
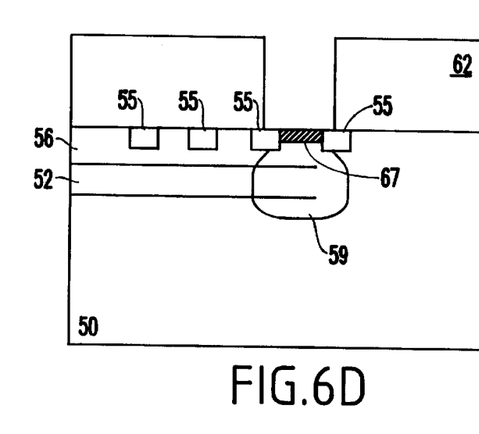
Figure 6E:
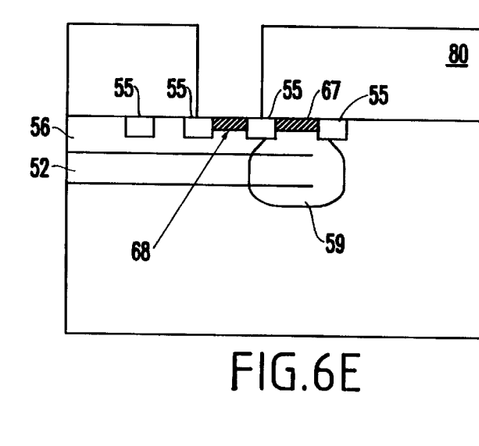
Figure 6F:
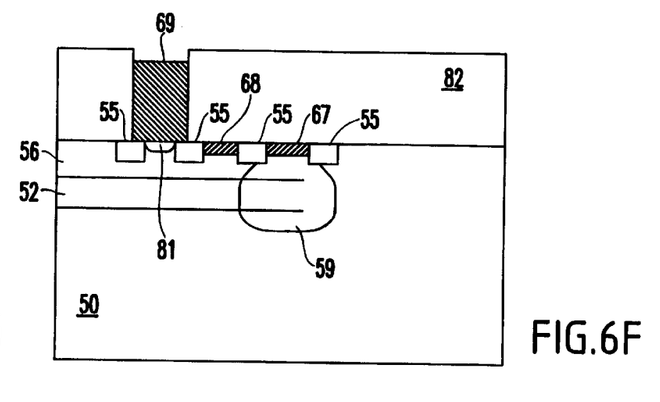
Figure 6G:
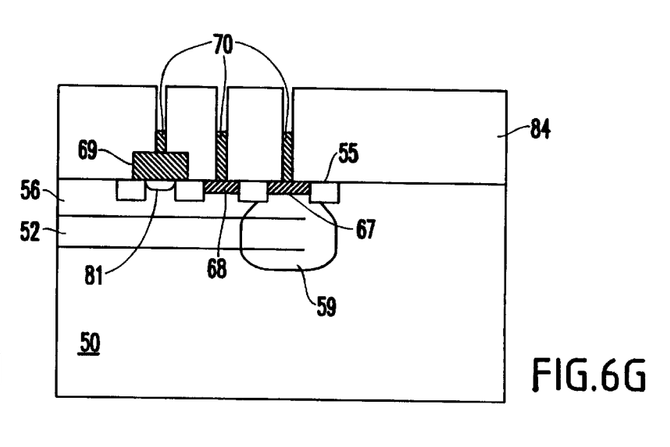
Figure 6H:
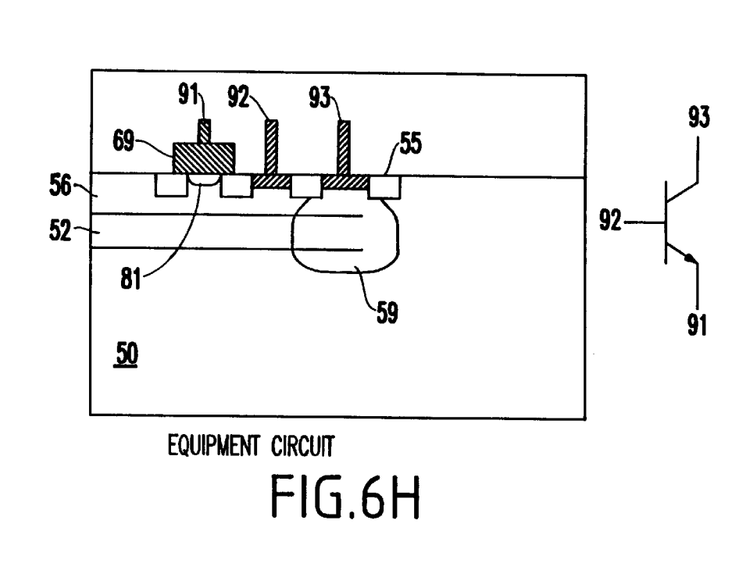

The bipolar device shown in FIG. 6H is fabricated in the present DRAM trench processing sequence 5A–5I, transforming a portion (or all) of a DRAM array block into a region where an array of vertical NPN bipolar devices can be fabricated.

As shown in FIG. 5A, a DRAM trench and collar 51 are fabricated in a P-type wafer 50. An N+ buried layer is implanted (e.g., trench plate) 52 and a buried outdiffused N+ layer 53 is formed. Also, a mask 54 is provided to protect support structures and a P– implant is performed to form isolated P-well 56. FIG. 6A is identical to FIG. 5A, except that the trench 51 and associated outdiffusion 53 are not formed. Instead, during such processing the bipolar device regions are protected with a previously existing mask (e.g., the mask used to pattern the deep trench 51). In the bipolar structure the N+ layer 52 becomes the collector and the P– layer 56 will become the base region.

As shown in FIG. 5B, the shallow trench isolation (STI) pattern 55 is defined in the DRAM structure area for trench isolation. Isolation features 55 are formed into the P-well 56. An optional array implant design level (e.g., PW1) is shown as items 57. In the inventive bipolar process shown in FIG. 6B, the same processing occurs. There is no difference in processing with respect to the DRAM, only the physical location of the isolation pattern is varied. With the invention, optional design implant levels PW2, PW3, NW1 can also optionally be added at the existing array implant PW1 57 to increase the ion (e.g., boron) concentration in the base 56. Since PW1 is a masking level implant, the base compensation for the bipolar device is optional. This provides flexibility in modifying the bipolar device based on changing DRAM requirements.

In FIG. 5C, a mask 54 is used in conjunction with an N– implant 58 to form an N-well region 59 which is used in the DRAM to provide a connection to the capacitor plate 52. Similarly, as shown in FIG. 6C, the N-well 59 is used to form a connection to the collector 52.

FIG. 5D depicts the formation of the DRAM transistor 60 and associated structures including a gate oxide 61, gate 62, sidewall spacers 63, lightly doped high resistance array junction 64. Also, an outdiffusing connection 65 is used from the trench node 51 to the other side of the DRAM device so as to make contact to the inner plate of the capacitor 66. All these fabrication spacers are unique to the DRAM and are blocked from the bipolar region, just as they would be blocked from the support devices. Therefore, in the drawings no corresponding "6" series Figure is shown with FIG. 5D.

Next, as shown in FIG. 5E, the N+ support junction 67 for a future contact is implanted over the N-well 59 using a mask 62. The N+ support junction 67, as shown in FIG. 6D, is simultaneously formed in the bipolar structure to contact the collector 52 N-well 59.

Also, as shown in FIGS. 5F and 6E, the P+ support junction 68 is implanted in the array to contact the array isolated P-Well 56 using another mask 80. In FIG. 6E the support junction 68 forms the connection to the base 56.

FIG. 5G depicts a doped (N+) stud 69 (e.g., polysilicon), which is used to connect to the bit line of the transistor 60. This is blocked from the standard NFET support devices using mask 82. As shown in FIG. 6F, the bipolar structure also receives the doped (N+) conductive stud 69 (e.g., polysilicon) that connects to the emitter 81. The N+ doping of the emitter 81 is diffused into the base region 56 using subsequent DRAM activation anneals. The stud 69 above the emitter 81 has substantially reduced resistance when compared to conventional bipolar structures. This feature of the invention reduces the terminal resistance of the inventive bipolar transistor and, correspondingly increases the bipolar device gain.

Next, as shown in FIGS. 5H and 6G a mask 84 with openings to the various connection regions is formed. Using the mask 84, P-well 68 and N-buried plates 67 may be implanted with P+ and N+ implants, respectively. These implants increase conductance and may be used to provide low resistance contacts. Then, interconnect metallurgy 70 (e.g., tungsten) is deposited in the mask 84 openings. The openings in the mask 84 are changed in the design data to account for the varying positions required for the DRAM and bipolar devices.

FIGS. 5I and 6H illustrate the structures after the removal of the mask 84. Some items are identified in FIGS. 5I and 6H to correspond with the schematic circuit diagrams shown next to the structures. In FIG. 5I, the DRAM features including gate 73, source 74, drain 75, deep trench capacitor 51, buried plate contact 77, and array P-well contact 76 are shown. Similarly, FIG. 6H depicts the vertical bipolar NPN structure and schematic circuit having the collecter 93 contact to the collector 52, the base contact 92 to the base 56, and emitter junction 91 connected to the emitter 81. This is shown as a ½ structure, and would be mirrored about a vertical line through the area identified as "91".

With respect to the foregoing, the non-standard DRAM optimization processes are performed by the invention in order to improve the performance of the vertical NPN bipolar device. In a first optimization, the DRAM block may be typically implanted with the P-well at voltage levels that would provide a base 56 (P-type doping) of approximately $4^{17}$. This value may be increased to approximately $8^{17}$ by adding the N-support surface doses into the array block (a no cost design alteration), and also by adding the low voltage PFET Boron surface tailor (again a no-cost design alteration). This improves and adverses the base width modulation effect, and thereby lowers the intrinsic sheet resistance of the base region. In a second optimization, the DRAM N+ polysilicon bit-line contact may be used to form a shallow diffused emitter-base junction, thus providing a well-defined base region, and high emitter efficiency due to the low emitter resistance.

While the foregoing is described with respect to an NPN bipolar device, one ordinarily skilled in the art would understand from this disclosure that a PNP device could be similarly formed. Thus, this invention provides a vertical NPN or the dual PNP devices integrated in a DRAM process, without compromising the anneals required for the DRAM array complex or the DRAM CMOS logic transistors. Further, the invention provides an improved emitter junction 69 that reduces the terminal resistance of the bipolar device.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A signal sensing circuit connected to a power supply terminal and having at least one input terminal and at least one output terminal, said signal sensing circuit comprising at least one bipolar transistor having a base, emitter and a single collector formed in an isolated P-well, wherein said input terminal is connected to said emitter;

at lean one current mirror amplifier connected to said power supply terminal, said current mirror amplifier having an input connected to said collector and having at least one output connected to said emitter, and a DC voltage source connected to said base.

2. The current sensing circuit of claim 1, wherein said output terminal is connected to said collector.

3. The current sensing circuit of claim 1, wherein said DC voltage source comprises a reference voltage.

4. The current sensing circuit of claim 1, wherein said DC voltage source comprises said power supply terminal.

5. The current sensing circuit of claim 1, wherein said current mirror amplifier comprises at least two metal oxide semiconductor transistors.

6. The current sensing circuit of claim 1, wherein said current mirror amplifier comprises two metal oxide semiconductor transistors.

7. The current sensing circuit of claim 1 wherein said output terminal is adapted to drive a metal oxide semiconductor current mirror current source.

8. A signal sensing circuit connected to a power supply terminal and having an input terminal and an output terminal, said signal sensing circuit comprising:

a bipolar Resistor having a base, emitter and a single collector formed in an isolated P-well, wherein said input terminal is connected to said emitter;

a current mirror amplifier connected to said power supply terminal, said current mirror amplifier including thee metal oxide semiconductor transistors and having an input connected to said collector and at least one output connected to said emitter, and a DC voltage source connected to said base.

9. The current sensing circuit of claim 8, wherein said output terminal is connected to said collector.

10. The current sensing circuit of claim 8, wherein said DC voltage source comprises a reference voltage.

11. The current sensing circuit of claim 8, wherein said DC voltage source comprises said power supply terminal.

12. The current sensing circuit of claim 8, wherein said output terminal is adapted to drive a metal oxide semiconductor current mirror current source.

* * * * *